United States Patent [19]
Yoshigi

[11] Patent Number: 6,030,259
[45] Date of Patent: *Feb. 29, 2000

[54] BUS BAR WIRING BOARD

[75] Inventor: Toshimasa Yoshigi, Shizuoka-ken, Japan

[73] Assignee: Yazaki Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/925,388

[22] Filed: Sep. 8, 1997

[30] Foreign Application Priority Data

Sep. 11, 1996 [JP] Japan ................................. 8-240508

[51] Int. Cl.[7] .................................................. H01R 11/09
[52] U.S. Cl. ........................................ 439/723; 439/949
[58] Field of Search .................................... 439/76.2, 949, 439/212, 723

[56] References Cited

U.S. PATENT DOCUMENTS

| | | | |
|---|---|---|---|
| 4,002,388 | 1/1977 | Menocal | 439/949 |
| 4,995,818 | 2/1991 | Saimoto | 439/76.2 |
| 5,023,752 | 6/1991 | Detter et al. | 439/76.2 |
| 5,207,591 | 5/1993 | Ozaki et al. | 439/949 |
| 5,722,851 | 3/1998 | Onizuka et al. | 439/949 |
| 5,759,053 | 6/1998 | Sugiyama | 439/949 |

*Primary Examiner*—Steven L. Stephan
*Assistant Examiner*—T. C. Patel
*Attorney, Agent, or Firm*—Finnegan, Henderson, Farabow, Garrett & Dunner, L.L.P.

[57] ABSTRACT

A bus bar wiring board has electric contact portions 11a, 11b projected in a tab terminal 11 perpendicularly folded and is constructed such that the electric contact portions 11a, 11b projected in the tab terminal 11 and a folded portion 11d of the tab terminal 11 do not overlap each other on a straight line perpendicular to the folded portion 11d. To achieve this construction, an approximately central portion 11c of the tab terminal 11 constituting the folded portion is punched and both sides of the punched portion 11c are set to the folded portion 11d of the tab terminal 11.

4 Claims, 4 Drawing Sheets

BUS BAR WIRING BOARD

BACKGROUND OF THE INVENTION

1. Field of the Invention

The present invention relates to a bus bar wiring board forming an internal circuit of an electric connection box used in wiring of an electric mounting circuit of an automobile, etc.

2. Description of the Related Art

With respect to a bus bar wiring board in a related art, a desirable wiring pattern can be formed by punching a thin sheet metal. Further, a tab terminal (a terminal for connection to an external circuit) can be simply formed by folding an end portion and an intermediate portion of the bus bar wiring board. Accordingly, the bus bar wiring board is used in many cases as a constructional member of an internal circuit of an electric connection box together with a printed wiring board.

Tab terminals of the bus bar wiring board punched in a desirable pattern are respectively formed in an end portion and an intermediate portion of this bus bar wiring board by folding processing. Electric contact portions are respectively formed as a semi-spherical or semi-cylindrical embossed projection in the tab terminals. In general, the electric contact portion having a semi-spherical shape is called a bead and the electric contact portion having a semi-cylindrical shape is called an indent.

Before the tab terminal is folded, the bus bar wiring board is punched from an unillustrated thin sheet metal and is entirely flat. Thereafter, the flat tab terminal is folded by a supporting die described later and a press die constructed by a pressing die.

However, when projecting directions of the electric contact portions and a folding direction of the tab terminal are equal to each other as in the tab terminal and a contact face of the above supporting die coming in contact with the tab terminal is a flat face, the electric contact portions interfere with this contact face and the tab terminal can not be accurately folded at a perpendicular angle.

Therefore, the supporting die constituting the press die is conventionally formed in a concave shape which does not interfere with the electric contact portions at a folding time of the tab terminal.

A concave groove of one stripe is formed in the supporting die at its center. A width of the concave groove in a short side direction thereof is set to be wider than a width a of each of the electric contact portions in a direction perpendicular to a longitudinal direction of the tab terminal.

A procedure of the folding processing of the tab terminal in the conventional bus bar wiring board is processed in a manner that the tab terminal is folded in the same direction as a projecting direction of each of the electric contact portions. The supporting die is arranged on a folded portion of the tab terminal. The pressing die is raised from below the tab terminal so that the tab terminal is folded.

At this time, the electric contact portion is inserted into the concave groove of the supporting die. The tab terminal comes in close contact with a contact portion of the supporting die without any clearance, and is perpendicularly folded.

However, the above-mentioned conventional bus bar wiring board has the following problems since the concave supporting die is used when the projecting direction of each of the electric contact portions and the folding direction of the tab terminal are equal to each other as in the tab terminal.

Firstly, since the folded portion of the tab terminal is simply formed in the shape of a flat plate, a portion of the tab terminal corresponding to the concave groove is folded without any support so that a folding accuracy is reduced when the concave supporting die comes in contact with such a tab terminal and the tab terminal is folded.

Secondly, when a width of the tab terminal is narrow, a thickness of the contact portion of the supporting die must be correspondingly narrowed so that no sufficient strength of the supporting die can be obtained and no supporting die can be constructed.

In such a case, even if the supporting die can be constructed, a contact area of the contact portion in the folded portion is reduced if the thickness of the contact portion of the supporting die is reduced. Accordingly, the folding accuracy of the tab terminal is greatly reduced.

Thirdly, a problem exists in that the above problems can be solved by changing the folding direction of the tab terminal or the projecting direction of each of the electric contact portions, but much labor and cost are required to change these directions.

SUMMARY OF THE INVENTION

The present invention has been achieved with such points in mind.

It therefore is an object of the present invention to provide a bus bar wiring board in which a tab terminal can be accurately folded even when a folding direction of the tab terminal is equal to a projecting direction of an electric contact portion, and the strength of a supporting die can be reliably secured in this case even at a narrow width of the tab terminal so that the degree of freedom of the layout of a wiring pattern can be widened without imposing any restriction on the folding direction of the tab terminal and the projecting direction of the electric contact portion.

To achieve the object, according to a first aspect of the present invention, there is provided a bus bar wiring board, comprising: a tab terminal being perpendicular folded at a folded portion; and an electric contact portion being projected from the tab terminal, wherein the electric contact portion and the folded portion of the tab terminal do not overlap each other on a straight line perpendicular to the folded portion.

In accordance with such a construction, no concave groove of a supporting die corresponds to the folded portion of the tab terminal. Further, the folded portion corresponds to only a contact portion of the supporting die. Accordingly, when the tab terminal is folded, the entire folded portion comes in contact with the contact portion of the supporting die and is supported by this contact portion so that a folding accuracy of the tab terminal can be improved.

More concretely, as stated hereinafter in a second aspect, an approximately central portion of the tab terminal constituting the folded portion is punched and both sides of the punched portion are set to the folded portion of the tab terminal. Furthermore, as stated hereinafter in a third aspect, a width of the punched portion in a direction perpendicular to the tab terminal is preferably set to be equal to or wider than a width of the electric contact portion in a direction perpendicular to the tab terminal.

According to a second aspect of the present invention, as it depends from the first aspect, the electric contact portion projected in the tab terminal and the folded portion of the tab terminal do not overlap each other on a straight line perpendicular to the folded portion. Accordingly, operations and effects similar to those of the bus bar wiring board of the first aspect can be obtained. The tab terminal is also supported by the folded portion on each of both the sides of the tab terminal in a stable state.

According to a third aspect of the present invention, as it depends from the second aspect, no punched portion perfectly overlaps the electric contact portion on a straight line perpendicular to the folded portion of the tab terminal. Namely, the folded portion reliably comes in contact with the contact portion of the supporting die and is supported by this contact portion. Accordingly, the folding accuracy of the tab terminal can be further improved.

According to a fourth aspect of the present invention, as it depends from the first aspect, one side of a portion of the tab terminal constituting the folded portion is cut off and the remaining portion of the tab terminal other than the notch portion is set to the folded portion of the tab terminal. Operations and effects similar to those of the bus bar wiring board of the first aspect can be also obtained in this construction of fourth aspect.

According to a fifth aspect of the present invention, as it depends from any one of the first aspect to the fourth aspect, a width of the folded portion in a direction perpendicular to the tab terminal is set to be widened in an outside direction of the tab terminal. In this construction, only an area of the folded portion can be widened even when the width of the tab terminal is narrow. As a result, a thickness of the contact portion of the supporting die is increased so that a strength of the supporting die can be reliably secured.

As stated above, in accordance with the bus bar wiring board of the present invention, the tab terminal can be accurately folded even when a folding direction of the tab terminal and a projecting direction of an electric contact portion are equal to each other. In this case, a strength of the supporting die can be reliably secured even when the width of the tab terminal is narrow. Thus, the degree of freedom of the layout of a wiring pattern can be widened without imposing any restriction on the folding direction of the tab terminal and the projecting direction of the electric contact portion.

BRIEF DESCRIPTION OF THE ACCOMPANYING DRAWINGS

The above and further objects and novel features of the present invention will more fully appear from the following detailed description when the same is read in conjunction with the accompanying drawings, in which.

DETAILED DESCRIPTION OF THE PREFERRED EMBODIMENTS

Figure 2:
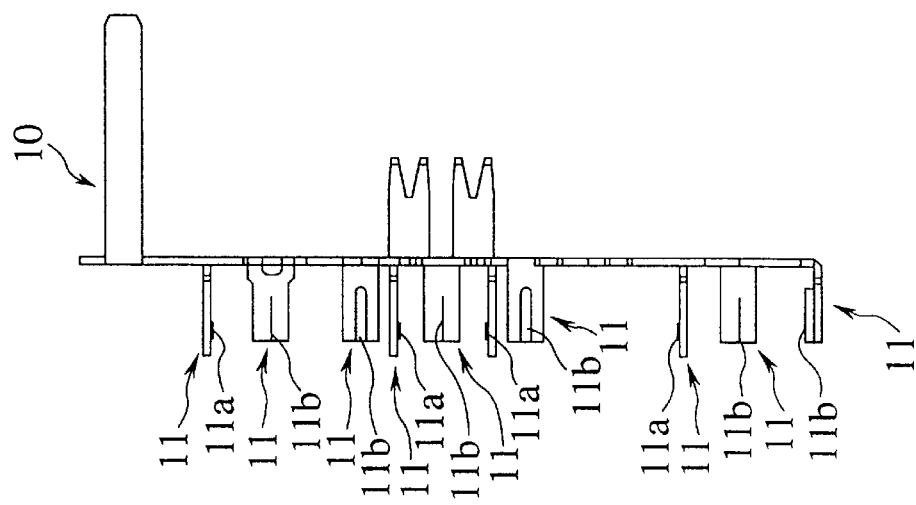
FIG. 2 is a side view of the bus bar wiring board of the present invention.
Figure 1:
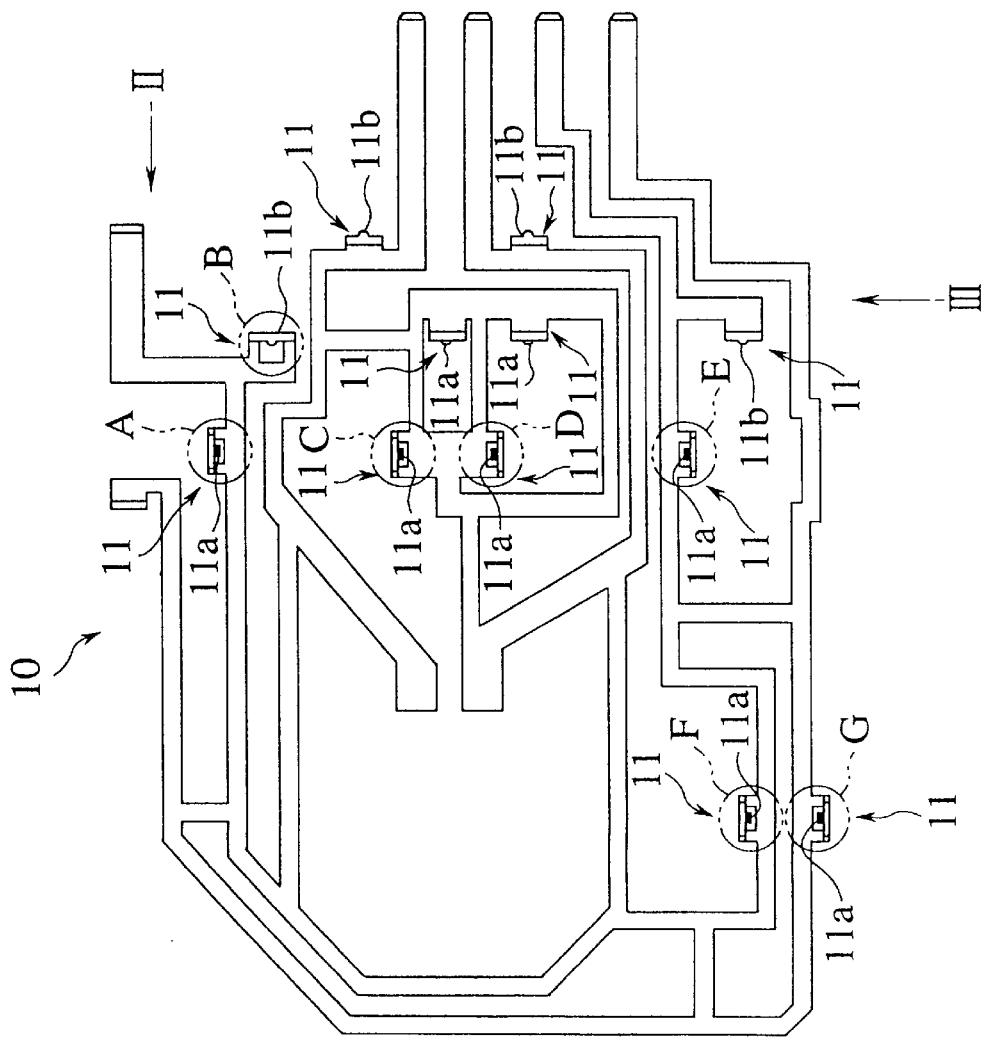
FIG. 1 is a front view of a bus bar wiring board in accordance with a first embodiment of the present invention.
Figure 3:
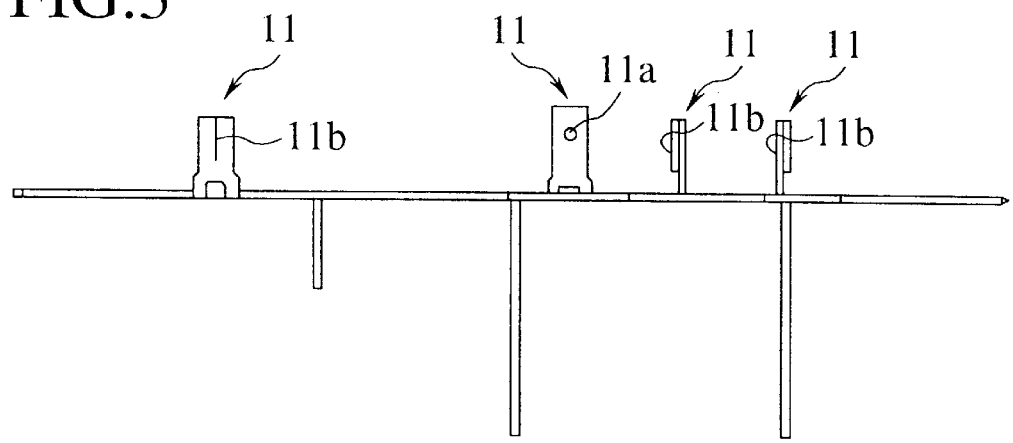
FIG. 3 is a bottom view of the bus bar wiring board of the present invention.
Figure 4:
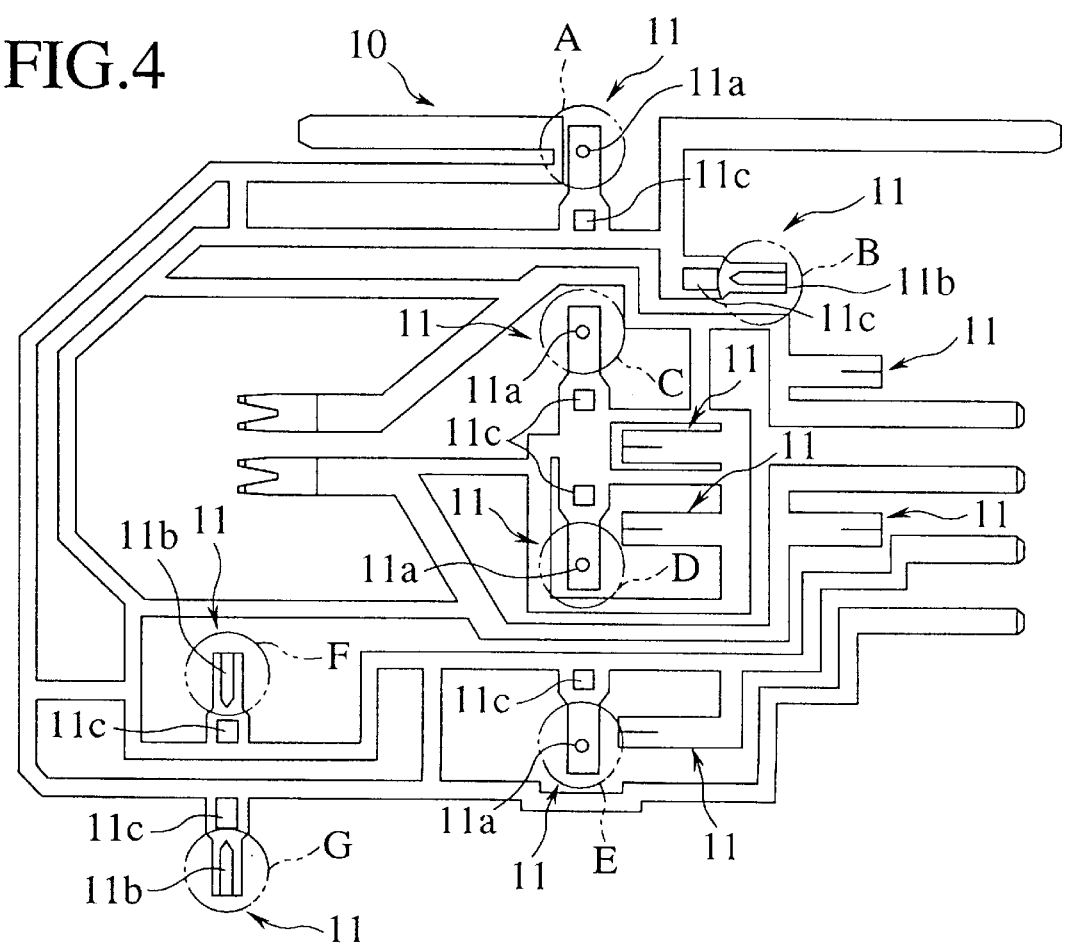
FIG. 4 is a front view showing the above bus bar wiring board before a tab terminal thereof is folded.

There will be detailed below the preferred embodiments of the present invention with reference to the accompanying drawings. Like members are designated by like reference characters.

The embodiments of a bus bar wiring board in the present invention will next be described with reference to the drawings.

Referring now to FIGS. 1 to 4, a bus bar wiring board in accordance with a first embodiment will be explained.

In these figures, reference numeral 10 designates the bus bar wiring board in accordance with this embodiment. Tab terminals 11 are formed by folding processing in an end portion and an intermediate portion of the bus bar wiring board 10. Electric contact portions 11a, 11b are formed in the respective tab terminals 11 and are constructed by embossed projections formed in a semi-spherical or semi-cylindrical shape.

Figure 5:
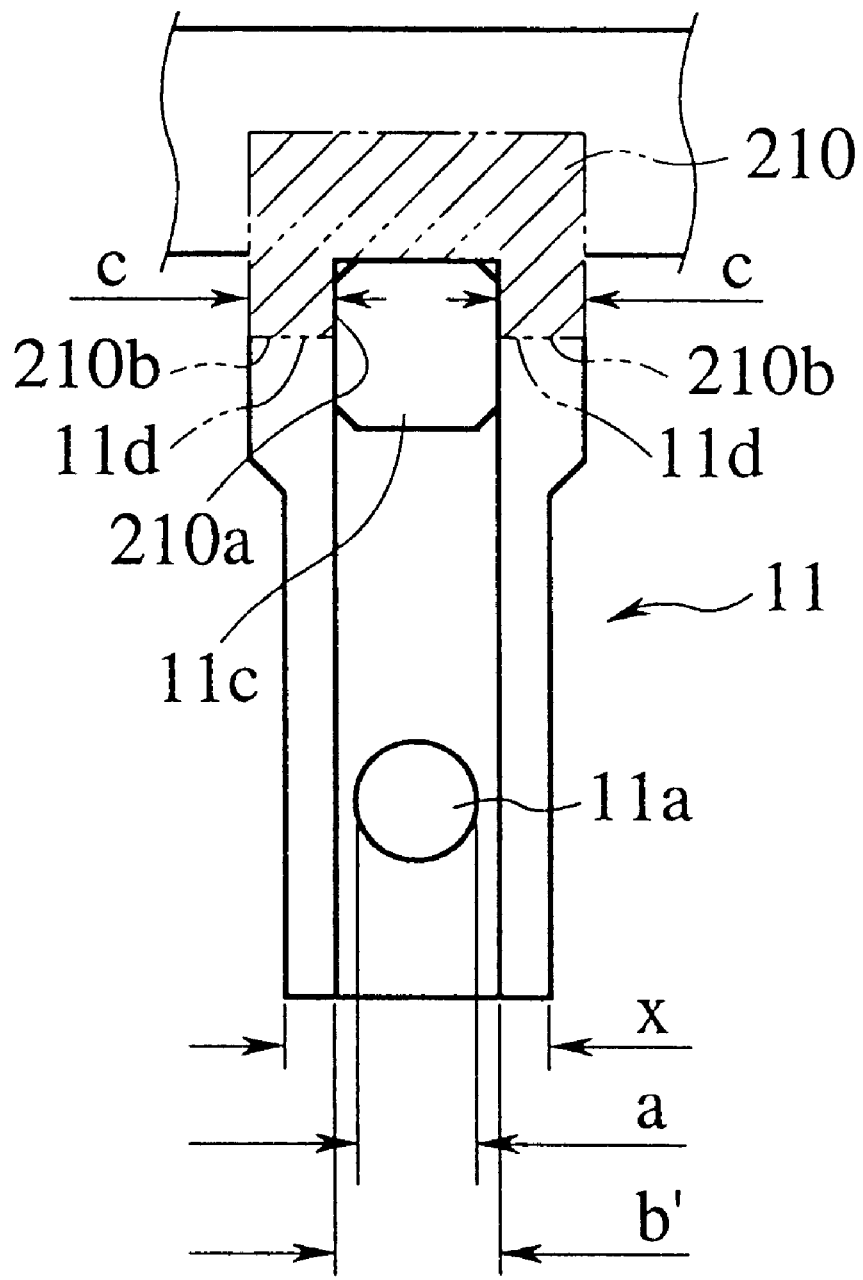
FIG. 5 is an enlarged view showing the tab terminal of the above bus bar wiring board.

In A, B, C, D, E, F and G in FIGS. 1 to 4, each of projecting directions of the electric contact portions 11a, 11b, is equal to a folding direction of each of the tab terminals 11. As shown in FIG. 5, approximately central portions of these tab terminals 11 constituting folded portions thereof are punched and both sides of these punched portions 11c are set to folded portions 11d, 11d.

Namely, the bus bar wiring board is constructed such that the electric contact portions 11a, 11b projected in the tab terminals 11 and the folded portions 11d, 11d of the tab terminals 11 do not overlap each other on a straight line perpendicular to each of the folded portions 11d, 11d.

A width b' of the punched portion 11c in a direction perpendicular to each of the tab terminals 11 is set to be wider than a width a of each of the electric contact portions 11a, 11b in a direction perpendicular to each of the tab terminals 11. Further, a width c of each of the folded portions 11d, 11d in a direction perpendicular to each of the tab terminals 11 is set to be widened in an outside direction of each of the tab terminals 11.

The width b' of the punched portion 11c is preferably set to be equal to or wider than the width b of a concave groove 210a of a supporting die 210.

These tab terminals 11 from A to G are folded by a press die constructed by the concave supporting die 210 and a pressing die cooperating with the supporting die 210.

In accordance with the bus bar wiring board 10 having the above construction in this embodiment, the approximately central portion of each of these tab terminals 10 constituting a folded portion thereof is punched so that no concave groove 210a of the supporting die 210 corresponds to each of the folded portions 11d, 11d of the tab terminals 11. Further, the folded portions 11d, 11d correspond to only contact portions 210b, 210b of the supporting die 210.

Accordingly, when the tab terminals 11 are folded, the entire folded portions 11d, 11d come in contact with the contact portions 210b, 210b of the supporting die 210 and are supported by these contact portions 210b, 210b. Therefore, a folding accuracy of each of the tab terminals 11 can be improved.

The tab terminals 11 are also supported by the folded portions 11d, 11d on both sides of the tab terminals 11 in a stable state.

Further, the width b' of the punched portion 11c in a direction perpendicular to each of the tab terminals 11 is set to be wider than the width a of each of the electric contact portions 11a, 11b in a direction perpendicular to each of the tab terminals 11. Accordingly, no punched portion 11c perfectly overlaps each of the electric contact portions 11a, 11b on a straight line perpendicular to each of the folded portions 11d, 11d of the tab terminals 11.

Thus, the folded portions 11d, 11d reliably come in contact with the contact portions 210b, 210b of the supporting die 210 and are supported by these contact portions 210b, 210b so that a folding accuracy of each of the tab terminals 11 can be further improved.

In addition to these, a width c of each of the folded portions 11d, 11d in a direction perpendicular to each of the tab terminals 11 is set to be widened in an outside direction of each of the tab terminals 11. Accordingly, only an area of each of the folded portions 11d, 11d can be widened even when a width X of each of the tab terminals 11 is narrow. As a result, thicknesses of the contact portions 210b, 210b of the supporting die 210 are increased and a strength of the supporting die 210 can be reliably secured.

A bus bar wiring board in accordance with a second embodiment of the present invention will next be explained with reference to FIG. 6.

Figure 6:
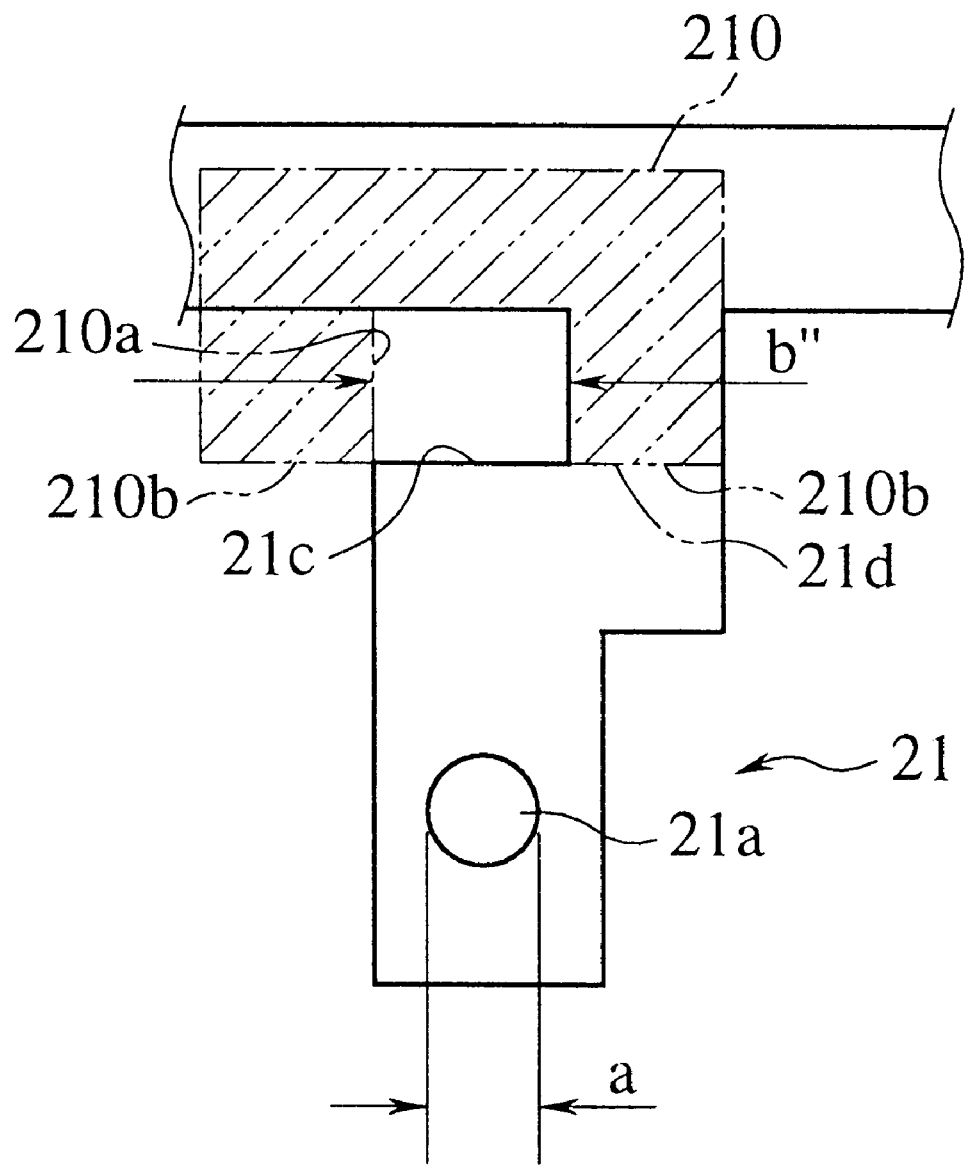
FIG. 6 is an enlarged view showing a tab terminal of a bus bar wiring board in accordance with a second embodiment of the present invention.

FIG. 6 is an enlarged view showing a tab terminal of the bus bar wiring board in accordance with the second embodiment of the present invention.

The bus bar wiring board in this embodiment is constructed such that one side of a portion of the tab terminal 21 constituting a folded portion thereof is cut off (a notch portion 21c) and the remaining portion of the tab terminal except for the notch portion is set to a folded portion 21d of the tab terminal 21.

A width b" of the notch portion 21c in a direction perpendicular to the tab terminal 21 is set to be wider than the width a of an electric contact portion 21a in a direction perpendicular to the tab terminal 21.

In accordance with such a construction, similar to the bus bar wiring board 10 in the first embodiment, no concave groove 210a of a supporting die 210 corresponds to the folded portion 21d of the tab terminal 21. Further, the folded portion 21d corresponds to only a contact portion 210b on one side of the supporting die 210.

Accordingly, when the tab terminal 21 is folded, the entire folded portion 21d comes in contact with the contact portion 210b on one side of the supporting die 210 and is supported by this contact portion 210b so that a folding accuracy of the tab terminal 21 can be improved.

While preferred embodiments of the present invention have been described using specific terms, such description is for illustrative purposes, and it is to be understood that changes and variations may be made without departing from the spirit or scope of the following claims.

What is claimed is:

1. A bus bar wiring board, comprising:

a tab terminal having a planar face and being perpendicularly folded at a folded portion;

an electric contact portion projecting from the planar face of the tab terminal;

wherein a central portion of the tab terminal defines a punched portion forming an aperture; and wherein a width of the punched portion is set equal to or greater than a width of the electric contact portion.

2. The bus bar wiring board as claimed in claim 1, wherein a width of the folded portion is widened in a direction extending outwardly from the punched portion.

3. The bus bar wiring board as claimed in claim 1, wherein one side of the folded portion of the tab terminal is cut off to form a notched portion.

4. The bus bar wiring board as claimed in claim 3, wherein a width of the folded portion is widened in a direction extending outwardly from the punched portion.

* * * * *